(12) United States Patent
Lin et al.

(10) Patent No.: US 7,187,078 B2
(45) Date of Patent: Mar. 6, 2007

(54) BUMP STRUCTURE

(75) Inventors: Tzu-Han Lin, Hsinchu (TW); Huei-Mei Yu, Hsinchu (TW); Chia-Jen Cheng, Taoyuan (TW); Chun-Yen Lo, Taichung (TW); Li-Hsin Tseng, Taichung (TW); Boe Su, Chiayi (TW); Simon Lu, Belmont, CA (US)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/938,594

(22) Filed: Sep. 13, 2004

(65) Prior Publication Data
US 2006/0055035 A1    Mar. 16, 2006

(51) Int. Cl.
*H01L 29/40* (2006.01)
(52) U.S. Cl. .................. 257/748; 438/614; 438/615
(58) Field of Classification Search .................. None
See application file for complete search history.

(56) References Cited
U.S. PATENT DOCUMENTS

| | | | |
|---|---|---|---|
| 6,356,500 B1 | 3/2002 | Cloud et al. | |
| 6,586,323 B1* | 7/2003 | Fan et al. | 438/614 |
| 6,854,633 B1* | 2/2005 | Grigg et al. | 228/33 |
| 7,034,402 B1* | 4/2006 | Seshan | 257/781 |
| 2003/0222352 A1* | 12/2003 | Kung et al. | 257/772 |
| 2004/0099959 A1* | 5/2004 | Tang | 257/778 |

* cited by examiner

*Primary Examiner*—Brook Kebede
*Assistant Examiner*—Su C. Kim
(74) *Attorney, Agent, or Firm*—Birch, Stewart, Kolasch & Birch, LLP

(57) ABSTRACT

Solder bump structures for semiconductor device packaging is provided. In one embodiment, a solder bump structure comprises a semiconductor substrate, the substrate has at least one contact pad and an upper passivation layer having at least one opening formed therein exposing a portion of the contact pad. At least one patterned and etched polymer layer is formed on a portion of the contact pad. At least one patterned and etched conductive metal layer is formed above the polymer layer and is aligned therewith. And at least one layer of solder material having a solder height is provided above the conductive metal layer, the layer of solder is aligned with the conductive metal layer, the layer of solder is thereafter reflown thereby creating a solder ball.

21 Claims, 4 Drawing Sheets

BUMP STRUCTURE

BACKGROUND

The present invention relates generally to the fabrication of semiconductor devices, and more particularly, to solder bump structures in the packaging of semiconductor devices.

Faster, reliable, and higher-density circuits at lower costs are the goals for integrated circuit (IC) packaging. Conventional wirebond technology, the most common method for electrically connecting aluminum bonding pads on a chip surface to the package inner lead terminals on the lead-frame or substrate has proven to be low cost and reliable. But for the future, packaging goals will be met by increasing the density of chips and reducing the number of internal interconnections. Packages with fewer interconnecting links lower potential failure points, reduce the circuit resistance, and reduce interconnect capacitance, which affects electrical performance. The need to reduce the IC package to fit end-user applications (e.g., smart cards, palmtop computers, camcorders, and so on) is driving the new packaging designs that reduce size and overall profile. This reduction is offset by the need for handling larger amounts of parallel data lines, therefore driving the need to increase package input/output requirements with more leads.

Advanced packaging designs are regularly introduced to solve packaging challenges. One such advanced package design is flip chip. Flip chip is a packaging method of mounting the active side of a chip (with the surface bonding pads) toward the substrate (i.e., upside down placement of the bumped die relative to the wirebonding approach—thus the reason for the term "flip" chip). It provides the shortest path from the chip devices to the substrate and low cost interconnection for high volume automated production. There is also a reduction in weight and profile since lead-frames or plastic packages are often not used. Flip chip technology uses solder bumps—usually formed from tin/lead solder in a 5% Sn and 95% Pb ratio—to interconnect the chip bonding pads to the substrate.

There are several methods known to those skilled in the art for producing solder bumps on a semiconductor device. FIGS. 1A–1E illustrate a prior art method of forming a bump on a substrate such as a semiconductor wafer. As shown in FIG. 1A, a semiconductor wafer 10 is provided having a base silicon substrate 12 with metal interconnect layers (not shown) overlying substrate 12 and an upper passivation layer 14, which may be one or more layers, that extends partially over a bond pad or contact pad 15 located on the upper surface of the semiconductor wafer 10. Passivation layer 14 has an opening overlying contact pad 15 so that electrical contact to an external circuit may be made from the semiconductor wafer 10. Contact pad 15 may be made from any of a variety of metals, such as aluminum, aluminum alloys, copper, and copper alloys. Typically, an under bump metallurgy (UBM) 16 is provided over the entire upper surface of semiconductor wafer 10 and over the upper surface of contact pad 15. UBM 16 may be composed of a plurality of individual layers of a variety of different metals and may be deposited by any of a variety of methods including electroless plating, sputtering, or electroplating. As shown in FIG. 1B, thereafter, a photoresist layer 22 is thereafter deposited over UBM 16 and patterned to provide an opening 24 overlying contact pad 15 on semiconductor wafer 10. Thereafter, a seed layer 26 may be deposited by conventional methods such as electroplating over UBM 16. An electrically conductive material 30 may then be deposited on top of seed layer 26 as shown in FIG. 1C and the electrically conductive material 30 includes solder, for example in a 63 weight percent Sn, 37 weight percent Pb eutectic composition. As shown in FIG. 1D, photoresist 22 is removed by plasma etching. FIG. 1E illustrates the step of reflowing the solder to provide a bump or ball 32 on semiconductor wafer 10.

After the solder bumps on a semiconductor device have been formed, typically an epoxy underfill is used in flip chip packaging. The underfill is typically an adhesive, such as an epoxy resin, that serves to reinforce the physical and mechanical properties of the solder joints between the IC chip and the substrate. The underfill improves the fatigue life of the packaged system, and also serves to protect the chip and interconnections from corrosion by sealing the electrical interconnections of the IC chip from moisture.

While the use of underfills has presented a solution to the problems associated with flip chip packaging, it has created new challenges for the semiconductor manufacturing process. In traditional solder bump structures, the new manufacturing steps required to apply the underfill, and to bake the assembly to harden the underfill, substantially complicate and lengthen the manufacturing process. An additional disadvantage to traditional solder bump structures in flip chip packaging has been that the use of an adhesive underfill can make it difficult, if not impossible, to disassemble the chip components when a defect is discovered after assembly of an electrical component. Because the solder assembly and underfill steps may occur simultaneously during the heating process, it is difficult to test the electronic assembly until the assembly is complete. Thus, if a defect is discovered, the underfill has already hardened, making removal and disassembly impractical. This results in increased production costs due to the waste of otherwise usable components.

For these reasons and other reasons that will become apparent upon reading the following detailed description, there is a need for an improved solder bump structure in advanced IC packaging such as flip chip that avoids the cost and reduced throughput concerns associated with conventional solder bump structures.

SUMMARY

The present invention is directed to solder bump structures, particularly, but not by way of limitation, for flip chip packaging of semiconductor devices. In one embodiment, a solder bump structure comprises a semiconductor substrate, the substrate has at least one contact pad and an upper passivation layer having at least one opening formed therein exposing a portion of the contact pad. At least one patterned and etched polymer layer is formed on a portion of the contact pad. At least one patterned and etched conductive metal layer is formed above the polymer layer and is aligned therewith. And at least one layer of solder material having a solder height is provided above the conductive metal layer, the layer of solder is aligned with the conductive metal layer, the layer of solder is thereafter reflown thereby creating a solder ball.

In another embodiment, a solder bump structure comprises a semiconductor substrate, the substrate has at least one contact pad and an upper passivation layer having at least one opening formed therein exposing a portion of the contact pad. At least one patterned and etched polymer layer is formed on a portion of the contact pad. At least one patterned and etched conductive metal layer is formed above the polymer layer and is aligned therewith. And at least one layer of solder material having a solder height is provided above the conductive metal layer, the layer of solder is aligned with the conductive metal layer, and the layer of solder is thereafter reflown thereby creating a solder ball.

In yet another embodiment, a solder bump structure comprises a semiconductor substrate, the substrate has at least one contact pad and an upper passivation layer having at least one opening formed therein exposing a portion of the contact pad. At least one patterned and etched polymer layer is formed on a portion of the contact pad. At least one patterned and etched conductive metal layer is formed above the surfaces of the polymer layer and the contact pad and portions of the passivation layer, the conductive metal layer is aligned with the polymer layer. And at least one layer of solder material having a solder height is provided above the conductive metal layer, the layer of solder is aligned with the conductive metal layer, the layer of solder is thereafter reflown thereby creating a solder ball.

In still another embodiment, a solder bump structure comprises a semiconductor substrate, the substrate has at least one contact pad and an upper passivation layer having at least one opening formed therein exposing a portion of the contact pad. At least one patterned and etched polymer layer is formed on the exposed surface of the contact pad. At least one patterned and etched conductive metal layer is formed above the surfaces of the polymer layer and portions of the passivation layer, the conductive metal layer is aligned with the polymer layer. And at least one layer of solder material having a solder height is provided above the conductive metal layer, the layer of solder is aligned with the conductive metal layer, the layer of solder is thereafter reflown thereby creating a solder ball.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1A:
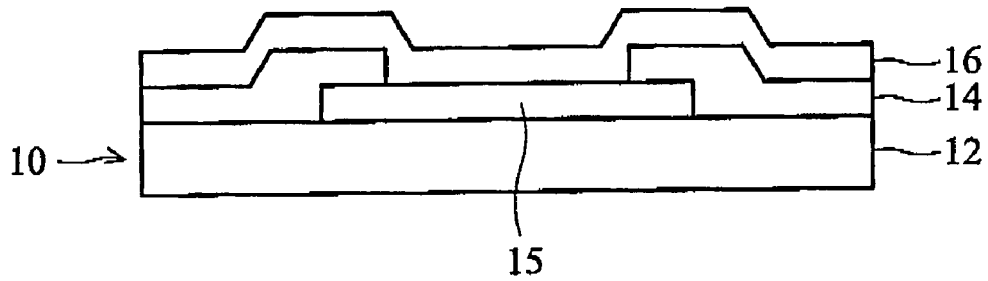
FIGS. 1A–1E are cross-sectional views of a semiconductor device depicting a prior art method of forming a solder bump structure.
Figure 1B:
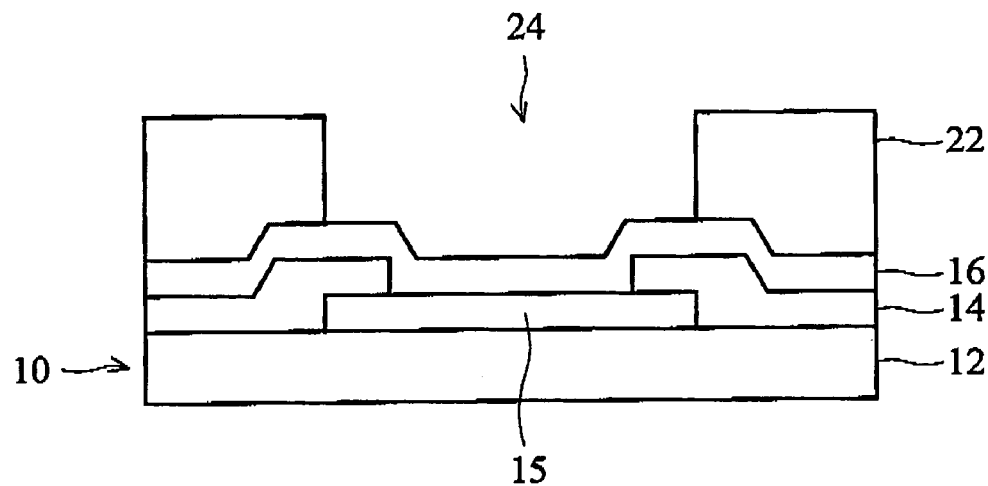
Figure 1C:
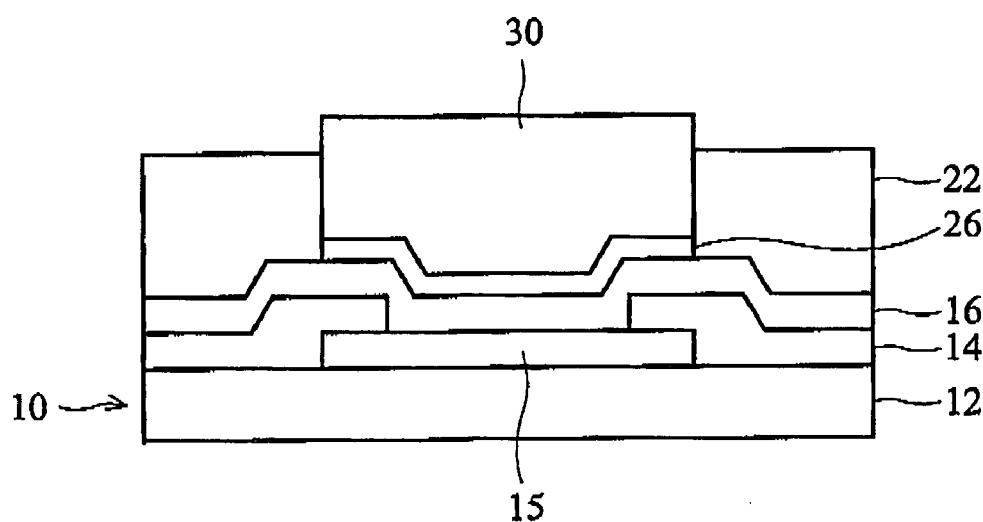
Figure 1D:
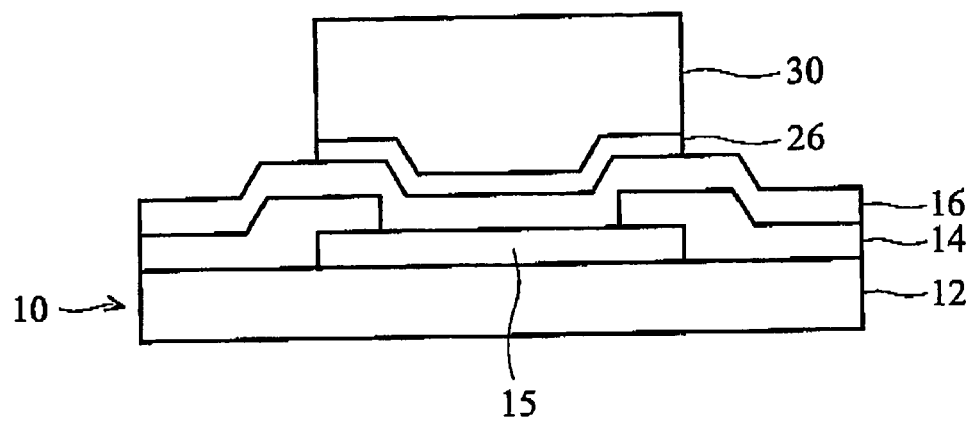
Figure 1E:
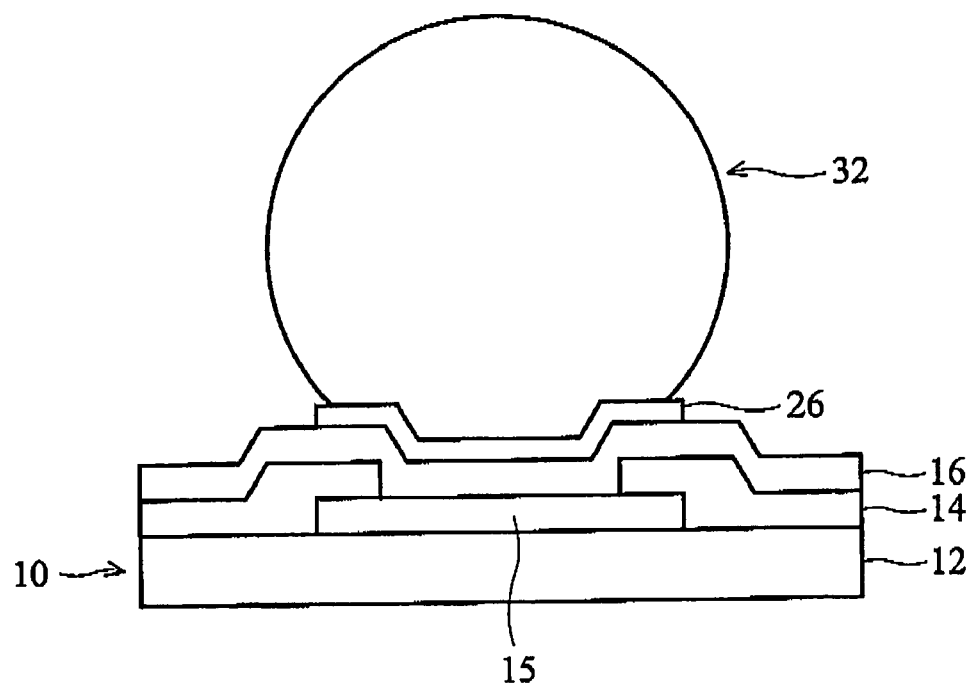
Figure 2:
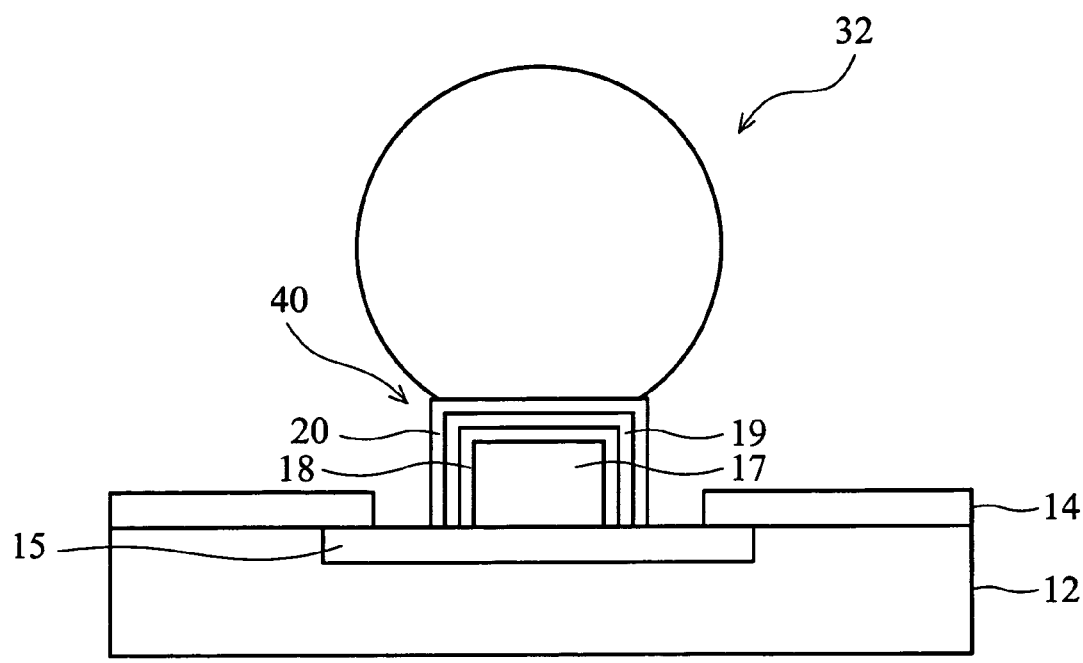
FIG. 2 is a cross-sectional view of a solder bump structure according to one embodiment of the present invention.

FIG. 2 is a cross-sectional view of a solder bump structure according to one embodiment of the present invention. The solder bump structure has a semiconductor substrate 12 and an upper passivation layer 14 overlying portions of a bond pad or contact pad 15. Semiconductor substrate 12 is understood to include active and passive devices, conductive layers and dielectric layers and the type of the substrate is a design choice dependent on the fabrication process being employed. Upper passivation layer 14 has an opening therein exposing a portion of contact pad 15 and may be comprised of a material such as for example, silicon nitride (SiN), silicon dioxide (SiO2), and silicon oxynitride (SiON). Contact pad 15 establishes electrical contact between the electrical interconnects in semiconductor substrate 12 and a later to be formed overlying solder bump. Contact pad 15 may be comprised of any of a variety of metals, such as for example, aluminum, aluminum alloys, copper, and copper alloys. Thereafter, a patterned and etched polymer body or polymer layer 17 is provided over a portion of contact pad 15. Polymer layer 17 may be deposited by any of a variety of methods, such as for example chemical vapor deposition and sputtering. The choice of materials for polymer layer 17 is important as polymer layer 17 must withstand temperatures encountered during bonding. Examples of polymers that may be used are silicons, carbons, fluoride, chlorides, parylene or teflon, polycarbonate (PC), polysterene (PS), polyoxide (PO), poly polooxide (PPO), benzocyclobutene (BCB). In one embodiment, polymer layer 17 may be polyimide and have a thickness of from about 5 microns to about 100 microns. Polyimide films can tolerate temperatures of up to 500 degrees C. without degradation of their dielectric film characteristics. In one embodiment, the polyimide may be polyamic acid polyimide such as "PROBIMIDE 7010" or "PROBIMIDE 514" produced by OCG Microelectronic Materials, Inc., Tempe, Ariz. In another embodiment, polymer layer 17 may be an epoxy having a thickness of from about 5 microns to about 100 microns. As polymer layer 17 relieves mechanical strain between the IC chip and the substrate, the solder bump structure of the present invention prevents the premature failures of the solder bumps due to solder cracks often associated with conventional solder bump structures.

Next, a patterned and etched conductive metal layer 40 is provided above the upper surface of the semiconductor wafer and polymer layer 17 and is aligned with polymer layer 17. One skilled in the art will understand that ideally, conductive metal layer 40 and polymer layer 17 need to be well chosen to be compatible with the temperatures used during the bonding process. Further, conductive metal layer 40 covering polymer layer 17 must be chosen to provide good adhesion to polymer layer 17. Conductive metal layer 40 may comprise of a BLM (ball limiting metallurgy) or UBM (under bump metallurgy). To prepare the semiconductor wafer for solder bumping, typically a cleaning step is provided. Further, the preparation may include preparing a pad metallurgy that will protect the integrated circuits while making good mechanical and electrical contact with a to be formed solder bump. Accordingly, protective metallurgy layers may be provided over the bond pad. UBM may comprise of successive layers of metal and in one embodiment, UBM may comprise of an adhesion layer 18, a wetting layer (19), and a protection layer (20). Adhesion layer 18 must adhere well to the polymer layer 17, contact pad 15 and the surrounding passivation layer(s), while providing a strong, low-stress mechanical and electrical connection. Wetting layer 19 provides a wettable surface for the molten solder during the solder bumping process, for good bonding of the solder to the underlying metal. Protection layer 20 may be provided to add reliable protection to the underlying layers and polymer layer 17.

UBM may be deposited by any of a variety of methods including, for example electroless plating, sputtering, or electroplating. After deposition of UBM, an electrically conductive material may be deposited over the conductive metal layer 40 and the deposition may be by evaporation, electroplating, electroless plating, and screen printing. The electrically conductive material may be any of a variety of metals, metal alloys or metals and mixtures of other materials, but preferably, the electrically conductive material is a solder. The solder may be any of a variety of compositions and in one embodiment the solder is in a 63 weight percent Sn, 37 weight percent Pb composition. Finally, the electrically conductive material (solder) is reflown by heating to form a ball or bump 32 on the semiconductor wafer as shown in FIG. 2.

The bonding of the IC chip and the substrate may be formed by conventional processes such as for example, thermocompression bonding, ultrasonic bonding, tape automated bonding, application of heat energy, or application of light energy. During the bonding process between the IC chip and the substrate, the polymer body or layer 17 in each bump structure may deform as electrical connection is formed. This deformation is important in forming a good electrical contact and the deformation requires a very small bonding force and produces little or no tendency to separate the connection after it has been made.

Unlike in conventional solder bump structures that require an epoxy underfill, the employment of the solder bump structure of the present invention in advanced IC packaging such as flip chip does not require the use of underfill. It is understood that negating the use of underfill simplifies and lessens the manufacturing process. Furthermore, a major challenge with the use of epoxy underfill is that the flip chip cannot be removed once the epoxy is applied. This creates problems of rework if the chip is found to be defective during test. The present invention solves this problem and saves production costs due to the waste of otherwise usable components. While the solder bump structure of the present invention in chip packaging does not require the introduction of underfill in the spaces or gaps remaining between the IC chip and the substrate, it is understood by those skilled in the art that such underfill may nevertheless be optionally used.

Figure 3:
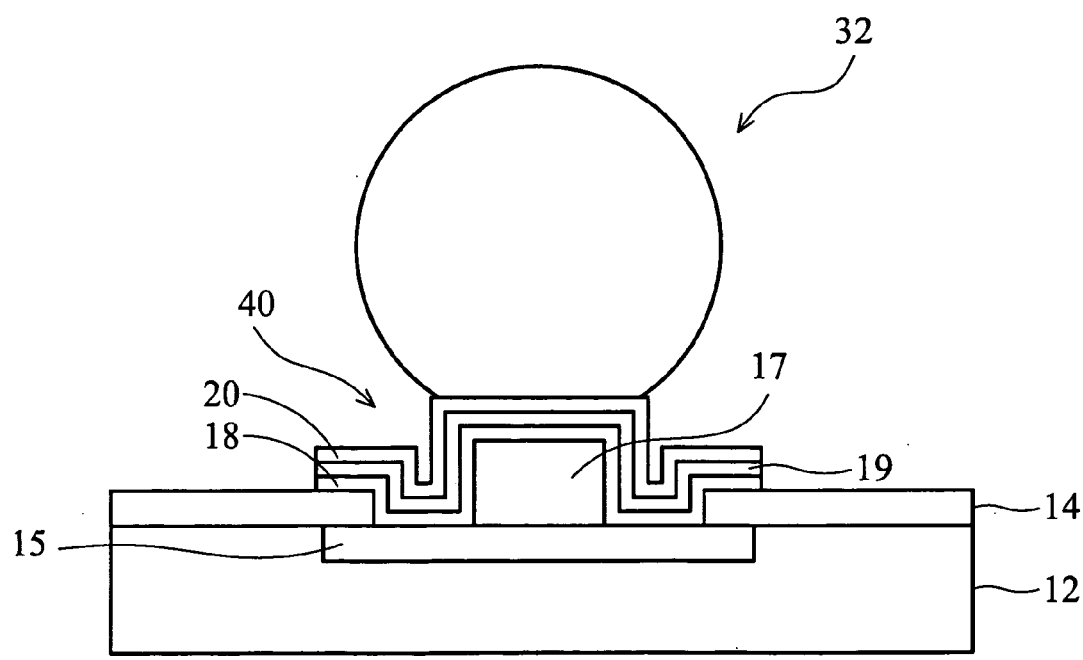
FIG. 3 is a cross-sectional view of a solder bump structure according to one embodiment of the present invention.

FIG. 3 is a cross-sectional view of a solder bump structure according to another embodiment of the present invention. FIG. 3 is identical to FIG. 2 except that in this embodiment, the patterned and etched conductive metal layer 40 is formed on the surfaces of polymer layer 17 and contact pad 15 and on portions of passivation layer 14. Other than the conductive metal layer 40, the solder bump structure is as described above with reference to FIG. 2.

Figure 4:
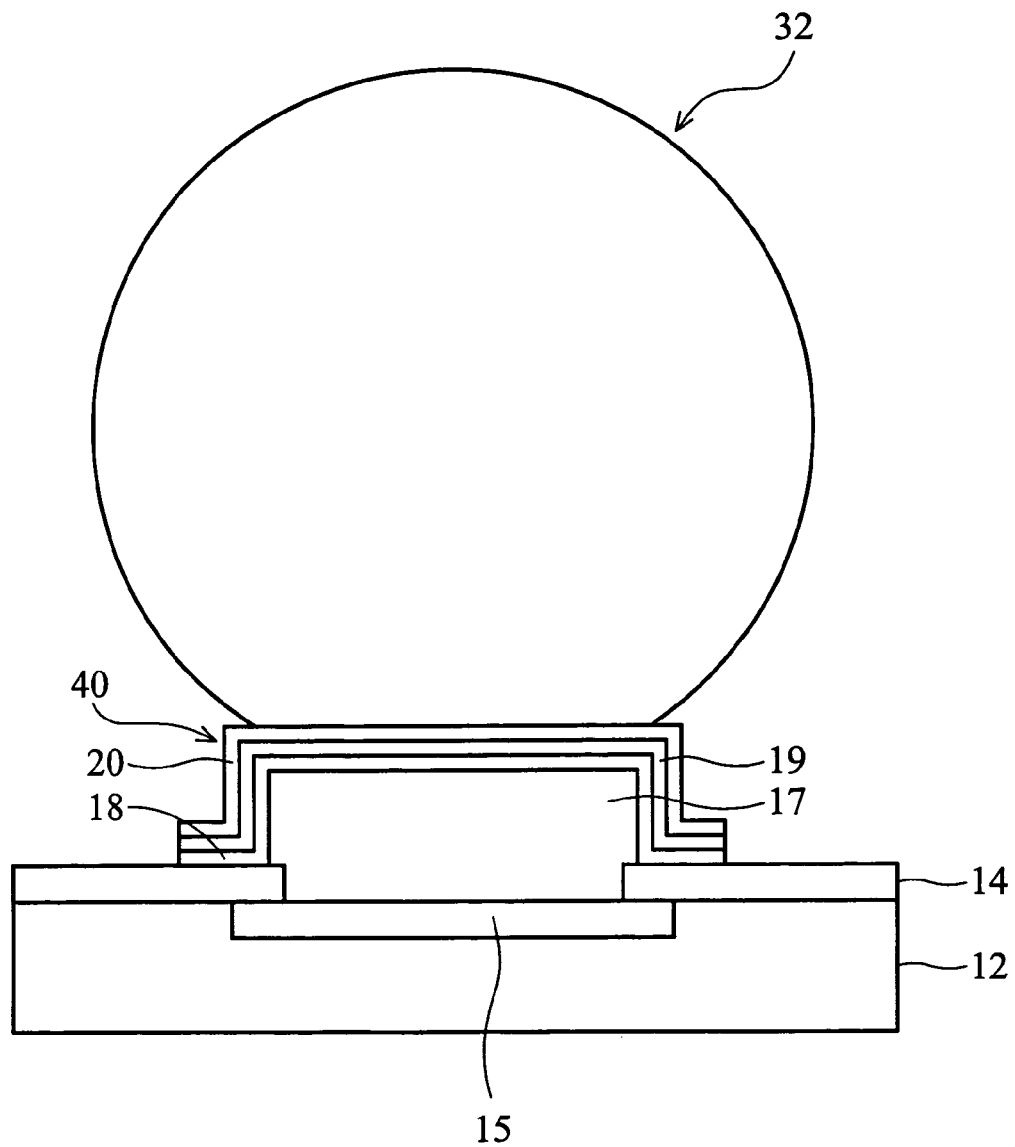
FIG. 4 is a cross-sectional view of a solder bump structure according to one embodiment of the present invention.

FIG. 4 is a cross-sectional view of a solder bump structure according to yet another embodiment of the present invention. FIG. 4 is identical to FIG. 2 except that in this embodiment, the patterned and etched polymer layer 17 is formed on the exposed surface of the contact pad 15. Further, the patterned and etched conductive metal layer 40 is formed on the surfaces of polymer layer 17 and on portions of the passivation layer 14. Other than the polymer layer 17 and the conductive metal layer 40, the solder bump structure is as described above with reference to FIG. 2.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A bump structure on a semiconductor substrate comprising:

a semiconductor substrate having at least one contact pad and an upper passivation layer having at least one opening formed therein exposing a portion of the contact pad;

at least one patterned and etched polymer layer formed directly on a central portion of the contact pad, wherein height of the patterned and etched polymer layer is less than ½ width of the contact pad;

at least one patterned and etched conductive metal layer formed directly above the polymer layer and being aligned therewith, wherein thickness of the patterned and etched conductive metal layer exceeds ⅓ height and ⅓ width of the patterned and etched polymer layer; and at least one layer of solder material having a solder height provided above the conductive metal layer, the layer of solder being aligned with the conductive metal layer, the layer of solder having been reflown thereby creating a solder ball.

2. The bump structure of claim 1, wherein the contact pad is a material selected from the group consisting of copper, copper alloy, aluminum, aluminum alloy, and combinations thereof.

3. The bump structure of claim 1, wherein the passivation layer is a material selected from the group consisting of silicon nitride (SiN), silicon dioxide ($SiO_2$) and silicon oxynitride (SiON).

4. The bump structure at claim 1, wherein the polymer layer comprises polyimide and has a thickness of from about 5 microns to about 100 microns.

5. The bump structure of claim 1, wherein the polymer layer comprises epoxy and has a thickness of from about 5 microns to about 100 microns.

6. The bump structure of claim 1, wherein the conductive metal layer comprises a UBM (Under Bump Metal) layer.

7. The bump structure of claim 6, wherein the UBM layer comprises:

an adhesion layer;

a wetting layer formed above the adhesion layer; and a protection layer formed above the wetting layer.

8. A bump structure on a semiconductor substrate comprising:

a semiconductor substrate having at least one contact pad and an upper passivation layer having at least one opening formed therein exposing a portion of the contact pad;

at least one patterned and etched polymer layer formed directly on a central portion of the contact pad, wherein height of the patterned and etched polymer layer is less than ½ width of the contact pad;

at least one patterned and etched conductive metal layer formed directly above the surfaces of the polymer layer and the contact pad and portions of the passivation layer, the conductive metal layer being aligned with the polymer layer, wherein thickness of the patterned and etched conductive metal layer exceeds ⅓ height and ⅓ width of the patterned and etched polymer layer; and at least one layer of solder material having a solder height provided above the conductive metal layer, the layer of solder being aligned with the conductive metal layer, the layer of solder having been reflown thereby creating a solder ball.

9. The bump structure of claim 8, wherein the polymer layer comprises polyimide and has a thickness of from about 5 microns to about 100 microns.

10. The bump structure of claim 8, wherein the polymer layer comprises epoxy and has a thickness of from about 5 microns to about 100 microns.

11. The bump structure of claim 8, wherein the conductive metal layer comprises a UBM (Under Bump Metal) layer.

12. The bump structure of claim 11, wherein the UBM layer comprises:
   an adhesion layer;
   a wetting layer formed above the adhesion layer; and
   a protection layer formed above the wetting layer.

13. A bump structure on a semiconductor substrate comprising:
   a semiconductor substrate having at least one contact pad and an upper passivation layer having at least one opening formed therein exposing a portion of the contact pad;
   at least one patterned and etched polymer layer formed directly on the exposed surface of the contact pad, wherein height of the patterned and etched polymer layer is less than ½ width of the contact pad;
   at least one patterned and etched conductive metal layer formed directly above the surfaces of the polymer layer and portions of the passivation layer, the conductive metal layer being aligned with the polymer layer, wherein thickness of the patterned and etched conductive metal layer exceeds ⅓ height and ⅓ width of the patterned and etched polymer layer; and
   at least one layer of solder material having a solder height provided above the conductive metal layer, the layer of solder being aligned with the conductive metal layer, the layer of solder having been reflown thereby creating a solder ball.

14. The bump structure of claim 13, wherein the polymer layer comprises polyimide and has a thickness of from about 5 microns to about 100 microns.

15. The bump structure of claim 13, wherein the polymer layer comprises epoxy and has a thickness of from about 5 microns to about 100 microns.

16. The bump structure of claim 13, wherein the conductive metal layer (16) comprises a UBM (Under Bump Metal) layer.

17. The bump structure of claim 16, wherein the UBM layer comprises:
   an adhesion layer;
   a wetting layer formed above the adhesion layer; and
   a protection layer formed above the wetting layer.

18. A bump structure on a semiconductor device comprising:
   a semiconductor substrate having at least one contact pad and an upper passivation layer having at least one opening formed therein exposing a portion of the contact pad;
   at least one patterned and etched polymer layer formed directly on a central portion of the contact pad, wherein height of the patterned and etched polymer layer is less than ½ width of the contact pad;
   at least one patterned and etched conductive metal layer formed directly above the polymer layer and being aligned therewith, wherein thickness of the patterned and etched conductive metal layer exceeds ⅓ height and ⅓ width of the patterned and etched polymer layer; and
   at least one layer of solder material having a solder height provided above the conductive metal layer, the layer of solder being aligned with the conductive metal layer, the layer of solder having been reflown thereby creating a solder ball.

19. A bump structure on a semiconductor wafer comprising:
   a semiconductor substrate having at least one contact pad and an upper passivation layer having at least one opening formed therein exposing a portion of the contact pad;
   at least one patterned and etched polymer layer formed directly on a central portion of the contact pad, wherein height of the patterned and etched polymer layer is less than ½ width of the contact pad;
   at least one patterned and etched conductive metal layer formed directly above the polymer layer and being aligned therewith, wherein thickness of the patterned and etched conductive metal layer exceeds ⅓ height and ⅓ width of the patterned and etched polymer layer; and
   at least one layer of solder material having a solder height provided above the conductive metal layer, the layer of solder being aligned with the conductive metal layer, the layer of solder having been reflown thereby creating a solder ball.

20. A flip chip substrate comprising:
   a semiconductor substrate having at least one contact pad and an upper passivation layer having at least one opening formed therein exposing a portion of the contact pad;
   at least one patterned and etched polymer layer formed directly on a central portion of the contact pad, wherein height of the patterned and etched polymer layer is less than ½ width of the contact pad;
   at least one patterned and etched conductive metal layer formed directly above the polymer layer and being aligned therewith, wherein thickness of the patterned and etched conductive metal layer exceeds ⅓ height and ⅓ width of the patterned and etched polymer layer; and
   at least one layer of solder material having a solder height provided above the conductive metal layer, the layer of solder being aligned with the conductive metal layer, the layer of solder having been reflown thereby creating a solder ball.

21. A flip chip package structure comprising:
   a semiconductor substrate having at least one contact pad and an upper passivation layer having at least one opening formed therein exposing a portion of the contact pad;
   at least one patterned and etched polymer layer directly formed directly on a central portion of the contact pad, wherein height of the patterned and etched polymer layer is less than ½ width of the contact pad;
   at least one patterned and etched conductive metal layer formed directly above the polymer layer and being aligned therewith, wherein thickness of the patterned and etched conductive metal layer exceeds ⅓ height and ⅓ width of the patterned and etched polymer layer; and
   at least one layer of solder material having a solder height provided above the conductive metal layer, the layer of solder being aligned with the conductive metal layer, the layer of solder having been reflown thereby creating a solder ball.

* * * * *